United States Patent
Watanabe et al.

(10) Patent No.: US 7,596,730 B2
(45) Date of Patent: Sep. 29, 2009

(54) TEST METHOD, TEST SYSTEM AND ASSIST BOARD

(75) Inventors: Yuya Watanabe, Tokyo (JP); Shigeru Sugamori, Tokyo (JP); Hiroaki Yamoto, Sunnyvale, CA (US)

(73) Assignee: Advantest Corporation, Tokyo (JP)

( * ) Notice: Subject to any disclaimer, the term of this patent is extended or adjusted under 35 U.S.C. 154(b) by 326 days.

(21) Appl. No.: 11/394,814

(22) Filed: Mar. 31, 2006

(65) Prior Publication Data

US 2007/0234146 A1 Oct. 4, 2007

(51) Int. Cl.
*G01R 31/28* (2006.01)
(52) U.S. Cl. .................................................. 714/724
(58) Field of Classification Search .............. 714/724, 714/742
See application file for complete search history.

(56) References Cited

U.S. PATENT DOCUMENTS

| | | | | |
|---|---|---|---|---|
| 5,894,484 | A * | 4/1999 | Illes et al. | 714/738 |
| 6,978,402 | B2 * | 12/2005 | Hirabayashi | 714/42 |
| 7,310,748 | B2 * | 12/2007 | Jeddeloh | 714/42 |
| 2003/0110427 | A1 | 6/2003 | Rajsuman et al. | |

FOREIGN PATENT DOCUMENTS

| | | |
|---|---|---|
| JP | 2000-171524 | 6/2000 |
| JP | 2003-98235 | 4/2003 |
| WO | WO-2004/063758 | 7/2004 |

OTHER PUBLICATIONS

International Search Report issued in International Application No. PCT/JP2007/057215 mailed on May 1, 2007 and partial English translation thereof, 4 pages.

* cited by examiner

*Primary Examiner*—James C Kerveros
(74) *Attorney, Agent, or Firm*—Osha • Liang LLP (57) ABSTRACT

A test method for testing a device under test by using an event tester is provided. The test method includes: receiving a test signal generated by the event tester and applied to the device under test and sequentially writing the same to a memory; reading sequentially the written test signal from the memory at the speed higher than that of the test signal generated by the event tester and applying the same to the device under test; acquiring the output signal outputted from the device under test in response to the applied test signal and sequentially writing the same at the speed higher than that of the test signal generated by the event tester; sequentially reading the written output signal from the memory and transmitting the same at the speed lower than that of the output signal outputted from the device under test; and determining pass/fail of the transmitted output signal by the event tester.

22 Claims, 11 Drawing Sheets

TEST METHOD, TEST SYSTEM AND ASSIST BOARD

BACKGROUND OF THE INVENTION

1. Field of the Invention

The present invention relates to a test method, a test system and an assist board. Particularly, the present invention relates to a test method, a test system and an assist board for testing a device which operates at high speed such as a high-speed memory interface included in such as a system IC using an event tester without a high-speed operating circuit.

2. Related Art

Generally, a test system provides a test signal to a device under test (DUT) for a semiconductor and receives an output signal generated by the DUT in response to the test signal. The test system retrieves the output signal by a strobe at a predetermined timing and compares the same with the expected value data to determine whether the DUT correctly operates.

Recently, an IC device referred to as SoC (System On a Chip, hereinafter referred to as system IC) has been used in various electronics devices. The system IC has one semiconductor chip including an IC circuit (core) such as a function blocks serving as different functions, a processor and a memory. Thereby the system IC achieves the objective comprehensive function.

The latest system ICs mostly include a high-speed memory such as a DDR (Double Data Rate) or a DDR-II, or such high-speed memory is connected to the system IC. Such system IC has a high-speed interface (hereinafter referred to as "high-speed memory interface") to transmit/receive signals between the function block and the high-speed memory. The operating speed of the high-speed memory interface is about such as 500 MHz.

Figure 1:
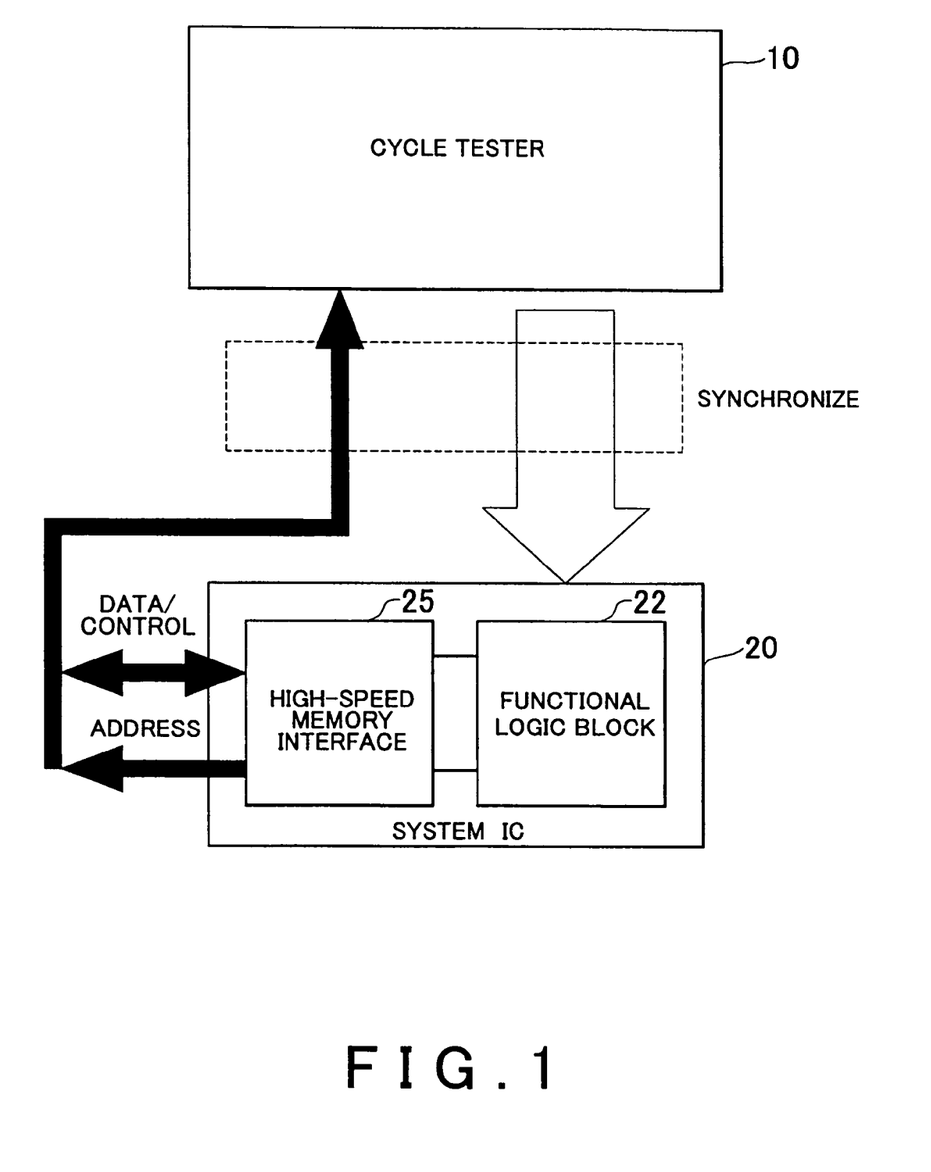
FIG. 1 shows the configuration of a conventional cycle based test system for testing a system IC20 having a high-speed memory interface 25 using a cycle tester 10.

FIG. 1 shows the configuration of the conventional cycle based test system for testing a test system IC20 using a cycle tester 10. The system IC20 includes a functional logic block 22 and a high-speed memory interface 25.

The cycle tester 10 generates an waveform of the test signal provided to the device under test by dividing the waveform for each test cycle. As for the cycle tester 10, the delay time based on a start point of the test cycle and the waveform selected from plural kinds of predefined waveforms are designated. Then, the cycle tester 10 generates an waveform designated at the designated timing for each test cycle. Therefore, the cycle tester 10 can output a test signal of which various waveforms are continued. Thus, the cycle tester 10 generates the test signal based on the waveform designated for each test cycle and the timing of the waveform.

The cycle based test system as shown in FIG. 1 uses the above-described cycle tester 10. The cycle based test system provides the test signal generated by the cycle tester 10 to the system IC20 as the device under test to determine whether pass/fail of the output signal outputted by the system IC20 in response to the provided test signal.

Here, the cycle tester 10 to test the system IC20 operates at an extremely high-speed test cycle and outputs the test signal in order to satisfy the specification of the high-speed memory interface 25, so that the configuration of the hardware and the test program are complicated. Accordingly, the high-speed cycle tester 10 satisfying the high-speed memory interface 25 of the system IC20 is very expensive and large in size.

Additionally, the functional logic block 22 and the high-speed memory interface 25 individually and asynchronously operate each other. Therefore, it is preferred that the cycle tester 10 independently and asynchronously outputs each test signal in order to asynchronously operate the functional logic block 22 and the high-speed memory interface 25 each other. Additionally, it is preferred that the cycle tester 10 asynchronously inputs each output signal generated from the output pin of the system IC20 and determines pass/fail of the same in the aim of the same. However, the cycle tester 10 have to synchronize the test signal and the output signal which are corresponded to each pin because the cycle tester 10 designates the waveform for each test cycle. It is the same as a test system using per-pin architecture. Accordingly, the conventional cycle tester 10 can not synchronize the test signal and the output signal, so that it has not been difficult to sufficiently test the system IC20.

Figure 2:
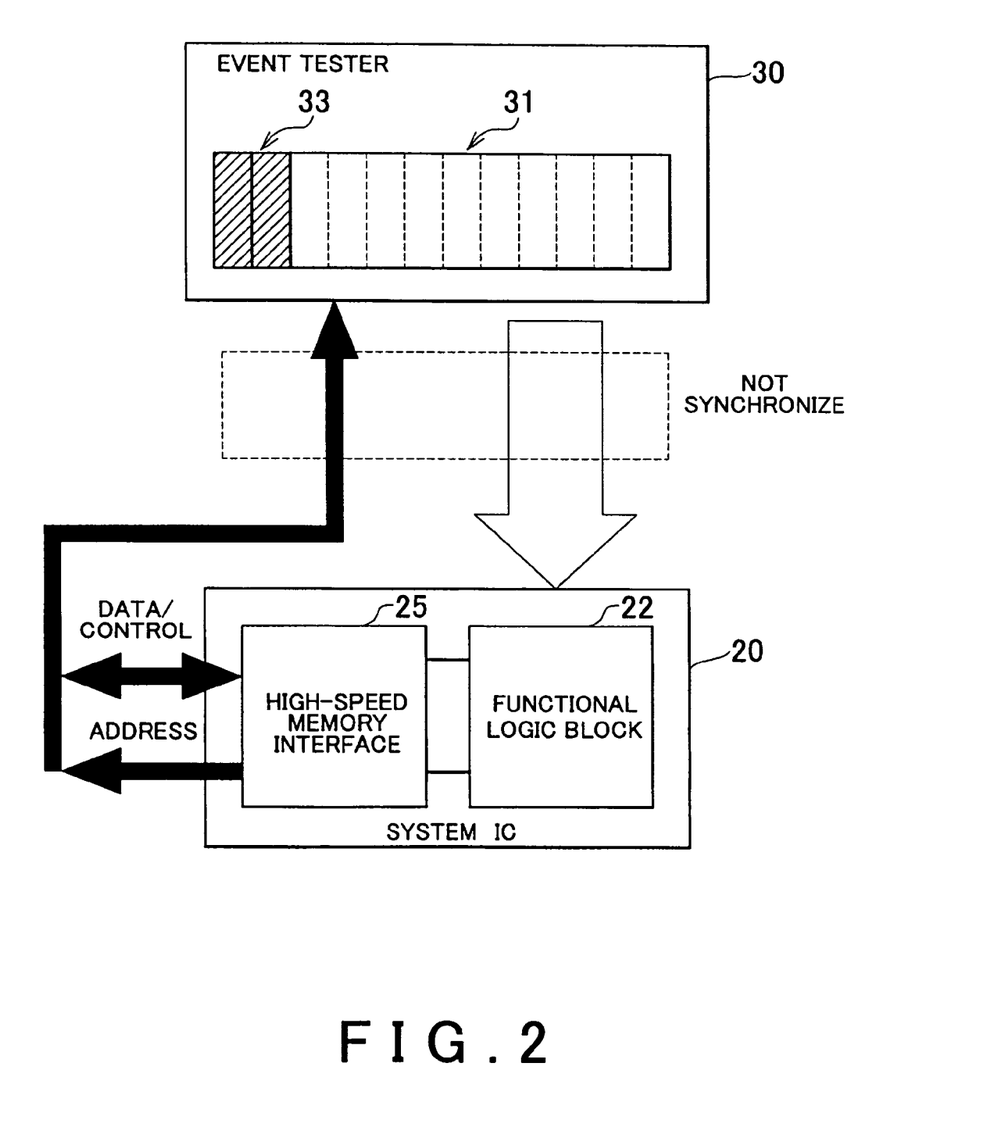
FIG. 2 shows the event based test system for testing the system IC20 having the high-speed memory interface 25 using an event tester 30 which has been recently proposed.

FIG. 2 shows the configuration of the conventional event based test system for testing the system IC20 using the event tester 30. Recently, the event based test system using an event tester 30 has been proposed. The event tester 30 does not operate based on the test cycle but generates a test signal based on an event (a rising edge and a trailing edge of a signal) and the timing of the event.

The event tester 30 provides a plurality of medium- speed or high-speed test modules 31 corresponding to each pin of the device under test. An event is independently defined for each of the test modules 31. Then, each test module 31 generates a test signal according to the defined event and receives the output signal to determine pass/fail. Therefore, each event tester independently and asynchronously operates in the event tester, so that the test signal and the output signal can be unsynchronized.

However, when the event tester 30 tests the high-speed such as the high-speed memory interface 25, the event tester 30 has to include a small number of high-speed test modules 33 in order to satisfy the test specification of the high-speed memory interface 25 in addition to a number of middle-speed and low-speed test modules 31. Thereby the conventional event based test system necessarily has been expensive. Therefore, the cost for serving as a test system has been increased in the conventional event based test system, so that it is difficult to sufficiently reduce the cost for testing. The difference of the configuration and the advantage between the cycle based IC test system and the event based IC test system has been described in detail in Japanese Patent Application Publication No. 2004-0216005, for example.

SUMMARY OF THE INVENTION

Thus, an object of the present invention is to provide a test method, a test system and an assist board being capable of solving the problem accompanying the conventional art. This object is achieved by combining the features recited in independent claims. Then, dependent claims define further effective specific example of the present invention.

In order to solve the above-described problem, a first aspect of the present invention provides a test method for testing the device under test using the event tester. The test method includes the steps of: receiving a test signal generated by the event tester and applied to the device under test and sequentially writing the same to a memory; reading sequentially the written test signal at the speed higher than the test signal generated by the event tester and applying the same to the device under test; acquiring the output signal generated by the device under test in response to the applied test signal and sequentially writing the same to the memory at the speed higher than the test signal generated by the event tester; reading sequentially the written output signal from memory and transmitting the same to the event tester at the speed higher than the output signal outputted from the device under test; and determining pass/fail of the transmitted output signal by the event tester.

The writing step may have the step of accessing the memory through a memory interface provided in the event tester. The reading step may have the step of accessing the memory through the memory interface provided in the event tester.

The test method may have the step of applying directly the test signal to a second device under test in parallel with testing the device under test and transmitting the responded output of the device under test to determine pass/fail of the second device under test. The test for the device under test and the test for the second device under test may be concurrently executed. The test signal used for each test may be unsynchronized. The device under test and the second device under test may be provided in the same system IC. The device under test may be a memory interface of the system IC and the second device under test may be a function logic block of the system IC.

A second aspect of the present invention provides a test system for determining pass/fail of a received output signal by using an event tester. The test system includes: a performance board on which a test device is placed; a memory connected between the event tester and a device under test; a writing section for receiving a test signal which is generated by the event tester and which is applied to the device under test and sequentially writing the same to the memory; an applying section for sequentially reading the written test signal at the speed higher than the test signal generated by the event tester and applying the same to the device under test; acquiring the output signal outputted from the device under test in response to the applied test signal and sequentially writing the same to the memory and reading sequentially the written output signal from the memory and transmitting the same to the event tester at the speed lower than the output signal outputted from the device under test. Thereby the test system determines of pass/fail of the transmitted output signal using the event tester.

The memory may have an operating speed equal to that of the device under test. The writing section may include a memory interface provided in the event tester and access the memory through the memory interface. The event tester may have a plurality of test modules. The writing section may include a memory interface provided in a predetermined test module among the plurality of test modules and access the memory through the memory interface. The reading section may include a memory interface provided in the event tester and access the memory through the memory interface.

The event tester may have a plurality of test modules. The reading section includes a memory interface provided in a predetermined test module among the plurality of test modules and access the memory at low-speed through the memory interface.

The test system may directly apply a test signal to the second device under test by the event tester in parallel with testing the device under test, transmitting the responded output of the second device under test to the event tester to determine pass/fail of the second device under test. The device under test and the second device under test may concurrently tested. The test signal used for each test may be unsynchronized. The device under test and the second device under test may be provided in one system IC. The device under test may be a memory interface of the system IC, and the second device under teat may be a functional logic block of the system IC.

When the maximum speed of the test signal generated by the event tester is lower than that of the test signal to be applied to the device under test, the memory may be connected between the event tester and the device under test.

The memory may have a first memory and a second memory. The applying section may sequentially read the test signal of a first test from the first memory and apply the same to the device under test. The acquiring section may acquire the output signal outputted from the device under test in response to the test signal of the first test and sequentially write the same to the first memory. The writing section may write the test signal of a second test generated by the event tester to the second memory before the test signal of the first test is completely applied to the device under test. The applying section may sequentially read the test signal of the second test from the second memory and apply the same to the device under test. The acquiring section may acquire the output signal outputted from the device under test in response to the test signal of the second test and sequentially write the same in the second memory. The reading section may sequentially read the written output signal from the first memory and transmit the same to the event tester after the output signal outputted from the device under test in response to the test signal of the first test is completely written to the first memory.

The test system further includes an expected value memory for storing an expected value signal indicative of the expected value of the output signal and a comparison section for comparing the output signal written to the memory with the expected value signal written to the expected value memory. The event tester may generate the test signal and the expected value signal. The writing section may write the test signal to the memory and also write the expected value signal to the expected value memory. The reading section may read the output signal which is not corresponded to the expected value signal from the memory and transmit the same to the event tester.

The test system may further include a change detecting section for detecting the change of the output signal and an address storage section for storing an address on the memory to which the changed output signal is written. The reading section may read the output signal written to the address stored in the address storage section from the memory.

The test system may further include an amount of delay changing section for changing the relative amount of delay between data transmitted between the device under test and the memory and the signal indicative of the clock of the data. The event tester may determine pass/fail of the device under test as changing the amount of delay and measure the margin of the amount of delay between the data and the signal indicative of the clock based on the determination.

The device under test may include the functional logic block and the memory interface for transmitting/receiving signals between the functional logic block and the functional logic block. The writing section may write an initial value to the memory before starting a test and write the test signal generated by the event tester to the memory to which the initial value is written.

A third aspect of the present invention provides an assist board which is used for a test system for testing a device under test placed on a performance board using an event tester and which is placed on the performance board when the maximum speed of the test signal generated by the event tester is lower than the speed of the test signal to be applied to the device under test. The assist board includes: a memory which is connected between the event tester and the device under test and to which the test signal to be applied to the device under test is written; an applying section for sequentially reading the written test signal at the speed higher than that of the test signal generated by the event tester and applying the same to the device under test and an acquiring section for acquiring the output signal outputted from the device under test in response to the applied test signal and sequentially reading the same to the memory. The test system includes a writing section for receiving the test signal generated by the event tester and applied to the device under test and sequentially writing the same to the memory and a reading section for sequentially reading the written output signal from the memory and transmitting the same to the event tester at the speed lower than that of the output signal outputted from the device under test.

Here, all necessary features of the present invention are not listed in the summary of the invention. The sub-combinations of the features may become the invention.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Additionally, it will be described the case that a system IC including a high-speed memory interface is tested in an embodiment of the present invention. However, the device under test of the present invention is not limited that, but various devices can be tested. Then, a test pin or test channel corresponding to each pin of the device under test can depen- dently and asynchronously operate each other in the event tester. Therefore, the event tester is most suitable for testing a device including a plurality of unsynchronized cores or functional blocks such as a system IC (SoC).

Figure 3:
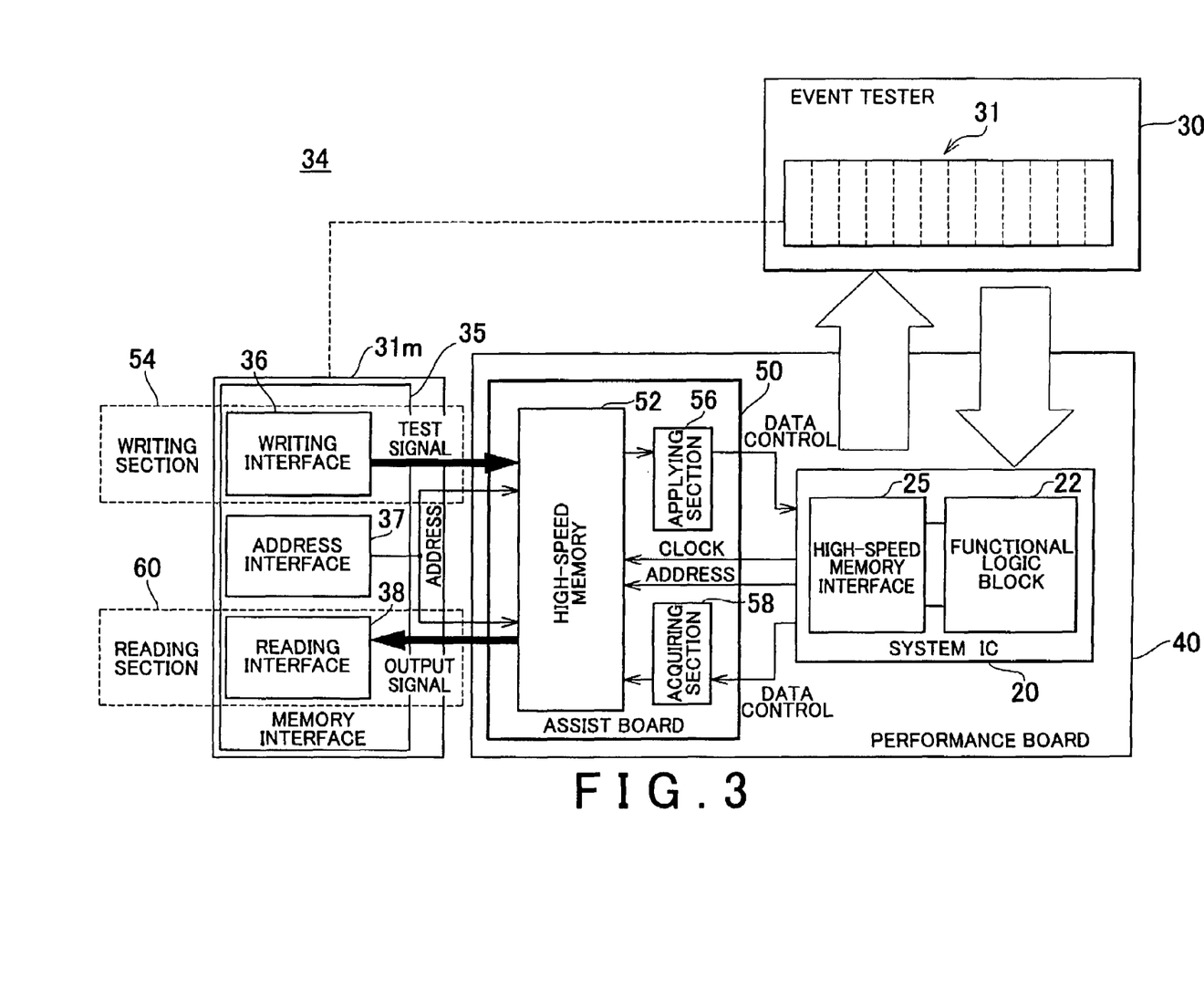
FIG. 3 shows the configuration of a test system 34 according to an embodiment of the present invention.

FIG. 3 shows the configuration of a test system 34 according to the present embodiment. The test system 34 tests a system IC20 placed on a performance board 40 using an event tester 30. The system IC20 is an example of the device under test according to the present invention. The system IC20 according to the present invention includes a functional logic block 22 and a high-speed memory interface 25 for transmitting/receiving signals between the functional logic block 22 and the external memory.

The test system 34 includes an event tester 30, a performance board 40, a high-speed memory 52, a writing section 54, an applying section 56, an acquiring section 58 and a reading section 60. The system IC20 is placed on the performance board 40. Further, an assist board 50 is attached to the performance board 40. The assist board 50 may be a part of the performance board 40.

A high-speed memory 52 is placed on the assist board 50. The high-speed memory 52 is an example of memory according to the present invention and is connected between the event tester 30 and the system IC20 as the result that the assist board 50 is attached to the performance board 40. The assist board 50 may be attached to the performance board 40 when the maximum speed of the test signal generated by the event tester 30 is lower than the speed of the test signal to be applied to the system IC20. That is to say, the assist board 50 may be attached to the performance board 40 when the even tester 30 can not generate a high-speed test signal which satisfies the test specification of the system IC20. Here, even if the maximum speed of the test signal generated by the event tester 30 is lower than the speed of the test signal to be applied to the system IC20, it is not necessarily that the assist board 50 is attached on the performance board provided that the high-speed memory 52 is connected between the event tester 30 and the system IC20.

The high-speed memory 52 may have an operating speed equal to or more than that of the high-speed memory interface 25 included in the system IC20 which is a DDR-II memory and a device under test, for example. Then such high-speed memory 52 temporarily stores test signal data (test signal) to be provided to the high-speed memory interface 25. The high-speed memory 52 temporarily stores the data (output signal) outputted from the high-speed memory interface 25.

The writing section 54 receives a test signal generated by the event tester 30 and applied to the system IC20 and sequentially writes the same to the high-speed memory 52. The applying section 56 sequentially reads the test signal written to the high-speed memory 52 at the speed higher than the speed of the test signal generated by the event tester 30 and applies the same to the system IC20. The applying section 56 may be provided on the assist board 50 along with the high-speed memory 52. The acquiring section 58 acquires the output signal outputted from the system IC20 in response to the applied test signal and sequentially writes the same to the high-speed memory 52. The acquiring section 58 may be provided on the assist board 50 along with the high-speed memory 52. The reading section 60 sequentially reads the written output signal from the high-speed memory 52 and transmits the same at the speed lower than the speed of the output signal outputted from the system IC20.

The writing section 54 may write an initial value to the high-speed memory 52 before starting a test and also write the test signal generated by the event tester 30 to the high-speed memory 52 to which the initial value has been written.

Thereby the high-speed memory interface 25 of the system IC20 can acquire data at initially operating without fail.

The event tester 30 has a plurality of medium/low-speed test modules 31. The test module 31 includes components such as a functional block for generating test signals of an event memory, an event adding logic and an event generator and a functional block for receiving the output signal and determining pass/fail. The test module 31 may be provided by a card inserted into a slot in the event tester 30. Here, the event tester 30 may not include a high-speed test module corresponding to the high-speed memory interface 25 of the system IC20.

The event tester 30 has a test module 31m for testing the high-speed memory interface 25 in the system IC20 as shown in the left side of FIG. 3 in the plurality of low or middle-speed test modules 31. The test module 31 m includes a memory interface 35 for transmitting/receiving signals to/from an external memory. The memory interface 35 serves as an interface for transmitting/receiving signals to/from the high-speed memory 52 provided in the assist board 50.

The memory interface 35 may include a writing interface 36, an address interface 37 and a reading interface 38, for example. The writing section 54 may include the writing interface 36 included in the memory interface 35 of the test module 31m. Then, the writing section 54 may access the high-speed memory 52 through the writing interface 36. In the same way, the reading section 60 may include the reading interface 36 included in the memory interface 35 of the test module 31 m. Then, the reading section 60 may access the high-speed memory 52 through the reading interface 35.

The writing interface 36 receives a test signal from the functional block generating the test signal and previously transmits the test signal to the high-speed memory 52 on the assist board 50. The writing interface 36 transmits the signal at the operating speed of the test module 31m. That is to say, the writing interface 36 transmits the test signal to the high speed memory 52 depending on the speed of the test signal generated by the event tester 30 (that is, lower than the test signal to be applied to the high-speed memory interface 25). Thus, the high-speed memory 52 stores the test signal previously received. The applying section 56 sequentially reads the test signal stored in the high-speed memory 52 at the speed higher than the speed of the test signal generated by the event tester 30 and applies the test signal to the high-speed memory interface 25. Therefore, the applying section 56 can apply the high-speed test signal satisfying the test specification of the high-speed memory interface 25 to the high-speed memory interface 25.

The high-speed memory interface 25 generates the output signal in response to the test signal applied by the applying section 56. The acquiring section 58 acquires the output signal from the high-speed memory interface 25 and sequentially writes the same to the high-speed memory 52. The reading interface 38 sequentially reads the output signal stored in the high-speed memory 52 and transmits the same to the functional block to determine pass/fail at the speed lower than that of the output signal outputted from the high-speed memory interface 25. The reading interface 38 transmits the output signal at the operating speed of the test module 31m. That is to say, the reading interface 38 transmits the output signal to the event tester 30 depending on the speed of the output signal received by the event tester 30 (that is, lower than the speed of the output signal outputted by the high-speed memory interface 25. Thereby the acquiring section 58 can cause the event tester 30 to determine pass/fail of the output signal outputted from the high-speed memory interface 25.

The address interface 37 generates an address to sequentially write a test signal and an address to sequentially read an output signal and provides them to the high-speed memory 52. The address interface 37 provides the addresses at the operating speed of the test module 31m.

As described above, the test system 34 can test the high-speed memory interface 25 without using a high-speed test module. That is, the test system 34 transmits/receives signals between the high-speed memory 52 provided on the assist board 50 and the high-speed memory interface 25 at a speed necessary to test the high-speed memory interface 25 and transmits/receives signals between the test module 31 and the high-speed memory 52 at medium/low-speed. Therefore, the test system 34 does not require any test module which operates at high speed.

Therefore, the test system 34 can reasonably test a high-speed device. When a high-speed IC device with an operating speed about 500 MHz is tested (for example, a system IC20 having the high-speed memory interface 25 with the operating speed about 500 MHz) using the test module 31 with the operating speed about 50 MHz, the test system 34 may include the high-speed memory 52 which can obtain at a relatively low price and has the operating speed equal to or more the speed of the high-speed memory interface 25. Meanwhile, the test module 31 operates at the speed 500 MHz, for example, the test system 34 has to include a number of high-speed functional blocks therein so that it will be significantly expensive. That is to say, the test system 34 can test at high speed using the inexpensive high-speed memory 52, so that the cost for testing can be significantly reduced. Additionally, in the test system 34, each test module 31 of the event tester 30 can asynchronously operate each other. Therefore, tests for the functional block 22 can be concurrently executed.

Figure 4:
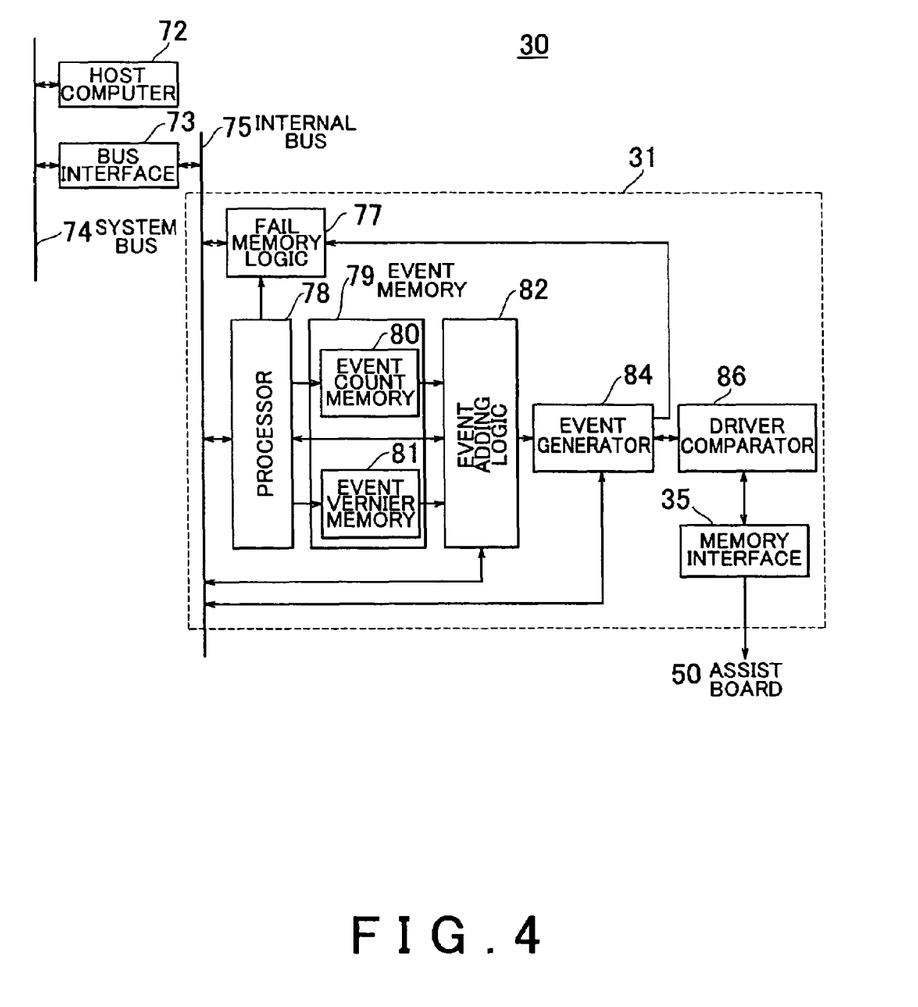
FIG. 4 shows an example of an event tester 30 according to the present embodiment.

FIG. 4 shows an example of an event tester 30 according to the present embodiment. The event tester 30 includes a plurality of test modules 31, a host computer 72 and a bus interface 73. Here, only one test module 31 is shown in FIG. 4, however, the event tester 30 may include a plurality of test modules 31 depending on the number of pins of the system IC20. Additionally, a memory interface 35 is shown in FIG. 4, however, the test module 31 which does not transmit/receive any test signal or output signal to/from the high-speed memory interface 25 may not include the memory interface 35.

The host computer 72 is a work station including an operating system such as a UNIX, Windows (registered trademark) or Linux, for example. The host computer 72 serves as a user interface to start and stop tests by the user, load a test program and the other test conditions, monitor and edit events, and analyze the test result. The host computer 72 connects the test module 31 through a system bus 74 and a bus interface 73.

The test module 31 includes an internal bus 75, a processor 78, a defect memory logic 77, an event memory 79, an event adding logic 82, an event generator 84, a driver comparator 86 and a memory interface 35.

The internal bus 75 connects each hardware in the test module 31. Each functional block in the test module 31 connects the other functional block through the internal bus 75. The processor 78 instructs each functional block in the test module 31 based on the test program and the test condition from the host computer 72. Each of the test modules 31 includes the processor 78 to cause the test module 31 to operate independent of the other test modules 31. Thereby the event tester 30 can asynchronously operate each test module 31 each other. The defect memory logic 77 stores the test result of the system IC 20, such as defect information on the address designated by the processor 78. The information stored in the defect memory logic 77 is used in the step of analyzing a defect of the device under test.

The event memory 79 stores timing data and the event type data for each event. The processor 78 provides address data to the event memory 79. The event memory 79 has an event count memory 80 and an event vernier memory 81, for example. The event count memory 80 stores timing data being integral multiple of the reference clock. The event vernier memory 81 stores timing data being fractional multiple of the reference clock.

The event adding logic 82 generates data indicative of comprehensive timing for each event based on the timing data from the event count memory 80 and the event vernier memory 81. The event adding logic 82 generates comprehensive timing data by storing the timing data of integral multiple and the timing data of fractional multiple. The event adding logic 82 may edit and change events by offsetting or scaling the timing.

The event generator 84 generates an event based on the comprehensive timing data from the event adding logic 82 and generates a test signal. The event generator 84 provides the generated test signal to the system IC 20 through a driver/comparator 86. When the high-speed memory interface 25 is tested through the high-speed memory 52 on the assist board 50, the event generator 84 provides the generated signal further through the high-speed memory 52 at low-speed.

Figure 5:
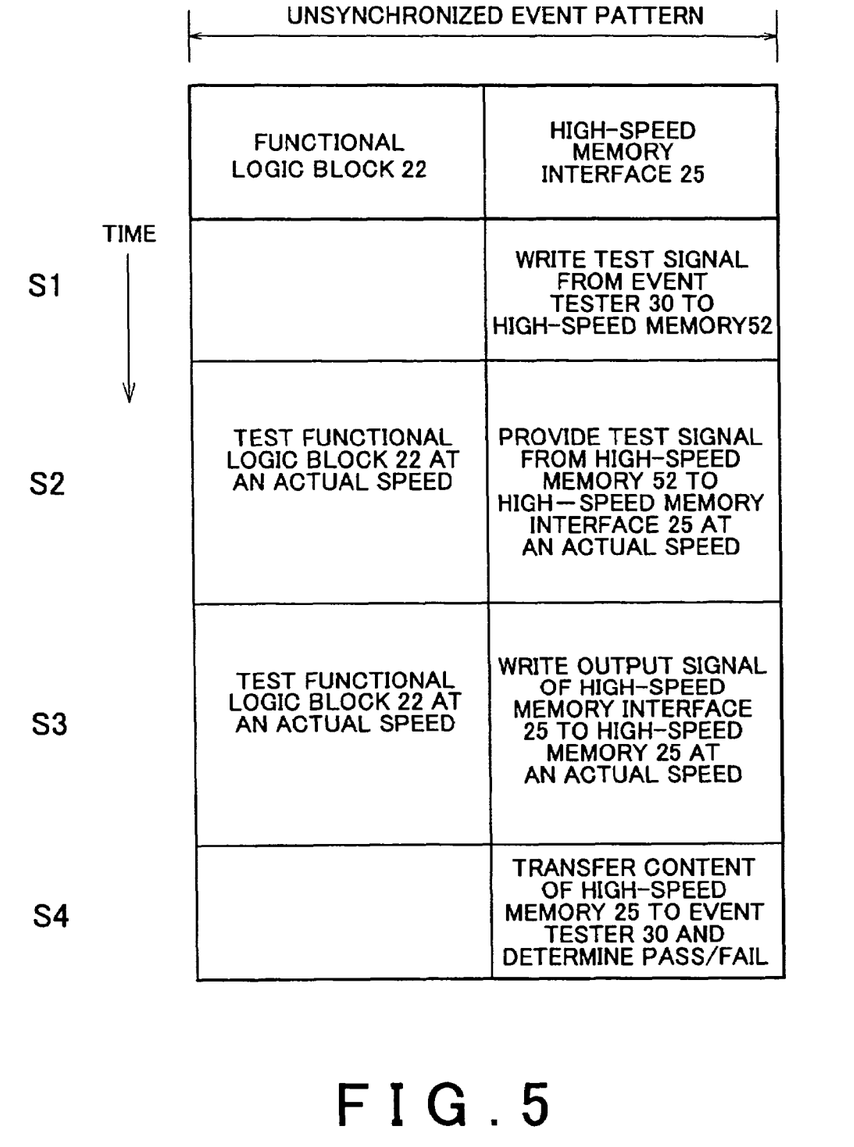
FIG. 5 shows an example of test procedure when a test system 34 according to an embodiment of the present invention concurrently tests the high-speed memory interface 25 and a functional logic block 22 in the system IC20.

FIG. 5 shows an example of test procedure when a test system 34 according to an embodiment of the present invention concurrently tests the high-speed memory interface 25 and a functional logic block 22 in the system IC 20.

Firstly, the test system 34 generates a test signal by the event tester 30 and writes the same on the high-speed memory 52 in order to test the high-speed memory interface 25 being an example of device under test in a step S1.

When the step S1 is ended, the test system 34 reads the test signal from the high-speed memory 52 at high-speed and applies the test signal to the high-speed memory interface 25 in real time while the test system 34 tests the functional logic block 22 being an example of second device under test. Here, the functional logic block 22 does not operate at a high speed as the high-speed memory interface 25. The test system 34 directly applies the test signal generated by the event tester 30 to the functional logic block 22 and directly transmits the responded output from the functional logic block 22 to the event tester 30 to determine pass/fail of the functional logic block 22. Each test signal used to test the high-speed memory interface 25 and the functional logic block 22 may be unsynchronized each other.

Next, in a step S3, the high-speed memory interface 25 generates an output signal in response to the applied test signal. The test system 34 writes the output signal to the high-speed memory at high-speed while the test system 34 tests the functional logic block 22 independent of the step S2. In this case, the event tester 30 directly applies the test signal generated by the event tester 30 and directly transmits the responded output from the functional logic block 22 to determine pass/fail of the functional logic block 22.

When the step S3 is ended, the test system 34 reads the output signal from the high-speed memory 52 at low-speed and determines pass/fail by the event tester 30. Thus, the test system 34 uses the event tester 30 being capable of asynchronously operating each of the test modules 31 each other, so that the different device under tests can be asynchronously and concurrently tested. Here, the test system 34 may concurrently test the other functional cores, the memory and the processor in addition to the high-speed memory interface 25 and the functional logic block 22. Here, it is described that a plurality of devices in the system IC 20 are tested for example in the present embodiment. However, the various IC devices based on the different chips may be tested.

As described above, the test system 34 can test the system IC 20 being a high-speed device under test by using the event tester without an expensive test module. Therefore, the test system 34 can reasonably test a device under test which operates at high speed such as the high-speed memory interface 25 of the system IC 20, so that the total cost for testing can be significantly reduced; Additionally, the test system 34 can asynchronously treat a test signal and an output signal, so that a device under test such as the system IC 20 in which the functional cores asynchronously operate each other by using the event tester 30 without any high-speed test module. That is to say, the test system 34 generates asynchronous test signal by using the event tester 30 so that two or more IC devices can be concurrently tested. As described above, the test system 34 can reduce the cost for tasting and make compact the system configuration.

Figure 6:
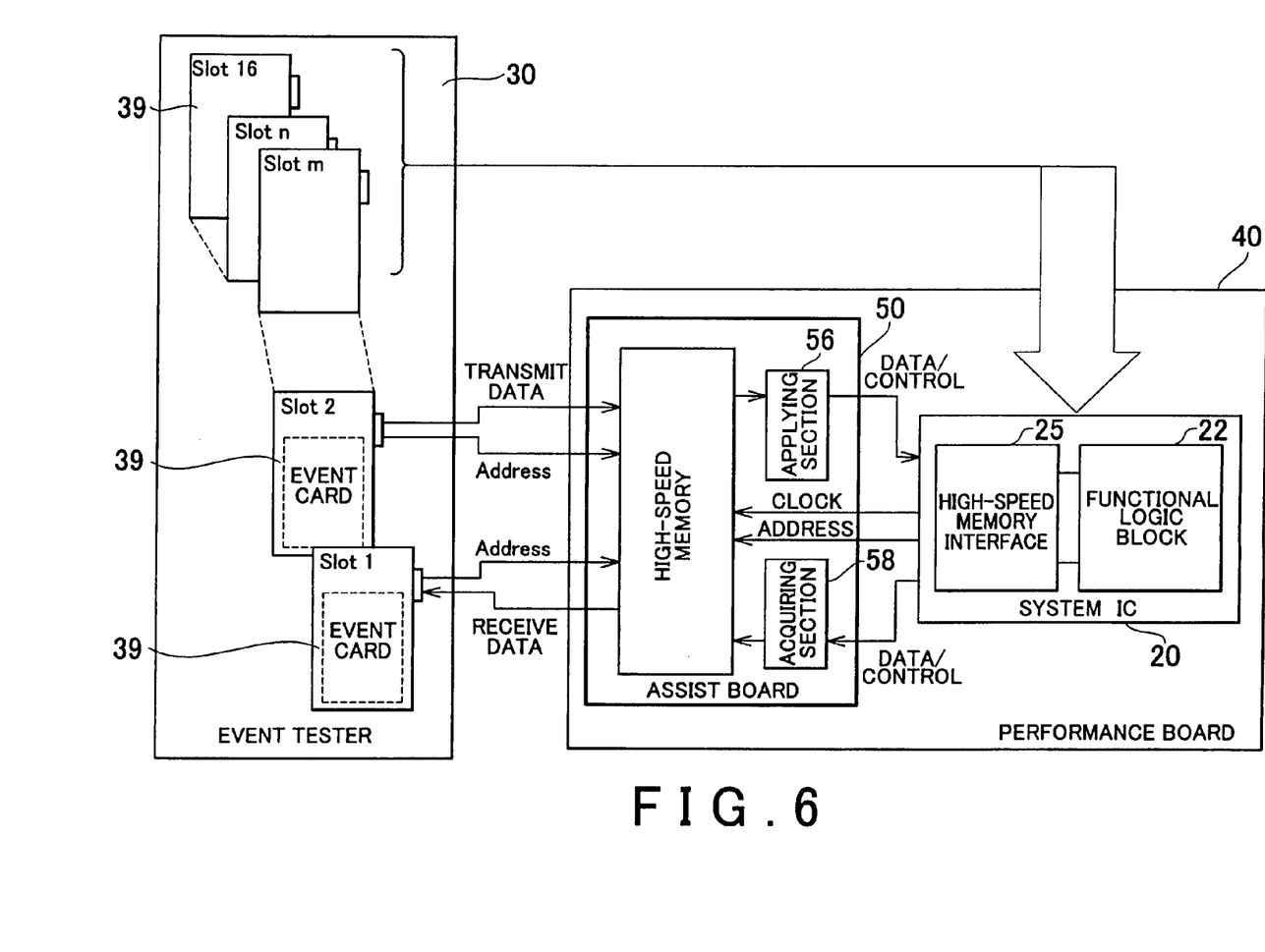
FIG. 6 shows the configuration of the test system 34 according to a first modification of an embodiment of the present invention.

FIG. 6 shows the configuration of the test system 34 according to a first modification of the present embodiment. The test system 34 according to the first modification has substantially the same configuration and function as those of the test system 34 as shown in FIG. 3, so that the description is omitted except for the difference. The event tester 30 according to the present modification has a plurality of standard slots 39 into which event cards including the test modules 31 are inserted. The event card including the test module 31 is inserted into the standard slot 39 corresponding to the pin of the system IC 20 being a device under test. The standard slot 39 may have a dimension and a pin arrangement based on the PXI standard. Such test system 34 can reasonably test various device under tests which are significantly compact.

Figure 7:
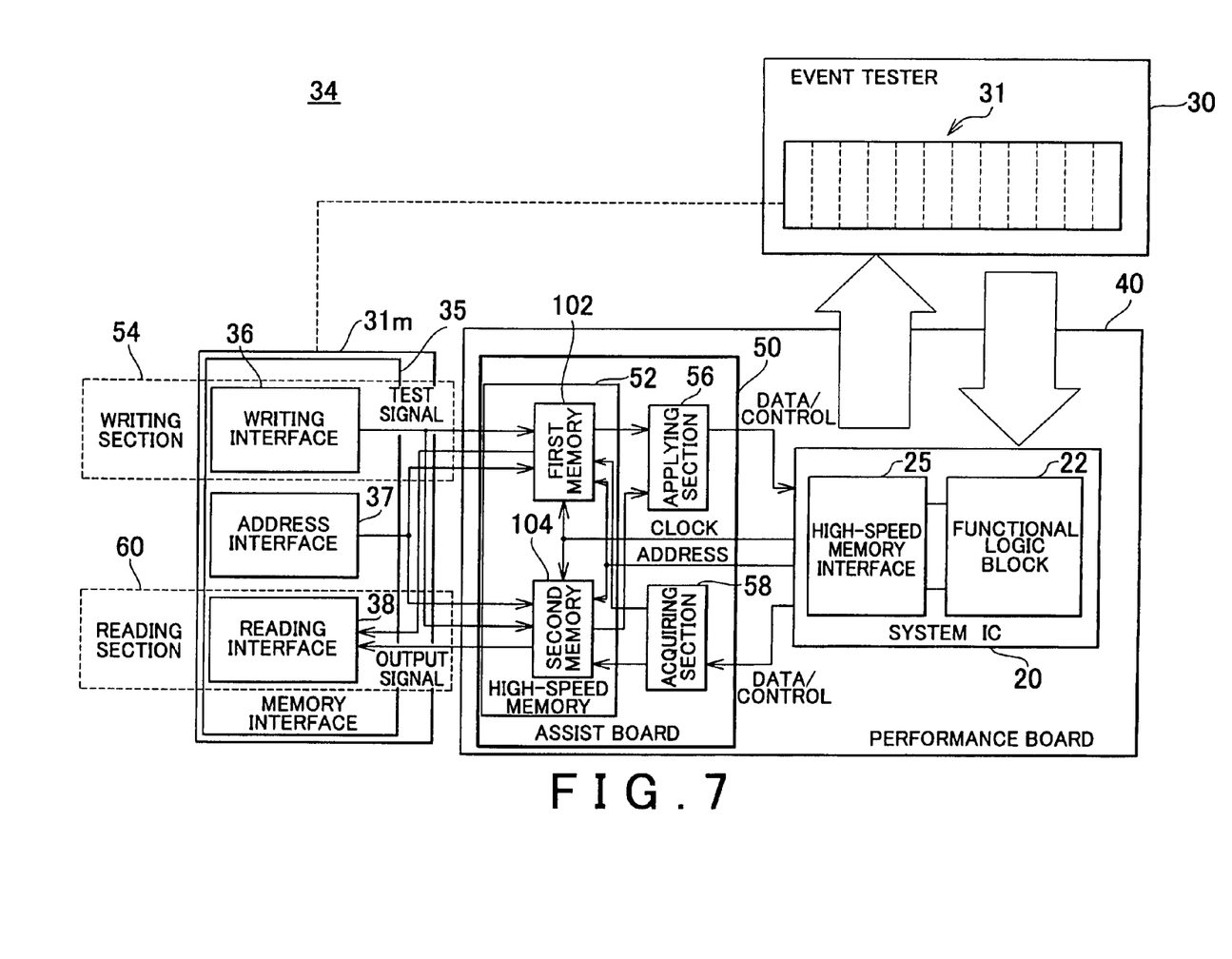
FIG. 7 shows the configuration of the test system 34 according to a second modification of an embodiment of the present invention.

FIG. 7 shows the configuration of the test system 34 according to a second modification of the present embodiment. The test system 34 according to the second modification has substantially the same configuration and function as the test system 34 as shown in FIG. 3, so that the description is omitted except for the difference. The high-speed memory 52 according to the present modification has a first memory 102 and a second memory 104. The first memory 102 and the second memory 104 are individually accessed from the outside.

Firstly, the writing section 54 sequentially writes the test signal of the first test generated by the event tester 30 to the first memory 102. Next, after the first memory 102 completely ends writing the test signal of the first test, the applying section 56 sequentially reads the test signal of the first test from the first memory and applies the same to the system IC 20. The acquiring section 58 sequentially writes the output signal which is outputted from the system IC 20 in response to the test signal of the first test.

Additionally, after the test signal of the first test is completely written to the first memory 102 and before the test signal of the first test is completely applied to the system IC 20, the writing section 54 writes the test signal of the second test generated by the event tester 20 to the second memory 104. For example, the writing section 54 may write the test signal of the second test to the second memory 104 while the applying section 56 applies the test signal of the first test to the system IC 20. Next, after completely applying the test signal of the first test to the system IC 20, the applying section 56 sequentially reads the test signal of the second test from the second memory 104 and applies the same to the system IC 20. The acquiring section 58 acquires the output signal outputted from the system IC 20 in response to the test signal of the second test and sequentially writes the same to the second memory 104. Then, after the output signal outputted from the system IC 20 in response to the test signal of the first test is completely written to the first memory 102, the reading section 60 sequentially read the written output signal from the first memory 102 and transmits the same to the event tester 30.

As thus described above, the test system 34 according to the second modification can transmit the test signal of the second test from the event tester 30 to the second memory 104 during applying the test signal of the first test from the first memory 102 to the system IC 20. Additionally, the test system 34 transmits the test signal of the first test from the first memory to the event tester 30 during acquiring the output signal of the first test from the system IC 20 to the second memory 104. Thereby the test system 34 according to the second modification can increase the amount of transmitting information between the event tester 30 and the high-speed memory 52. Therefore, the test system 34 can use the test module 31 which generates test signal with lower speed and test the system IC 20 with higher speed.

Figure 8:
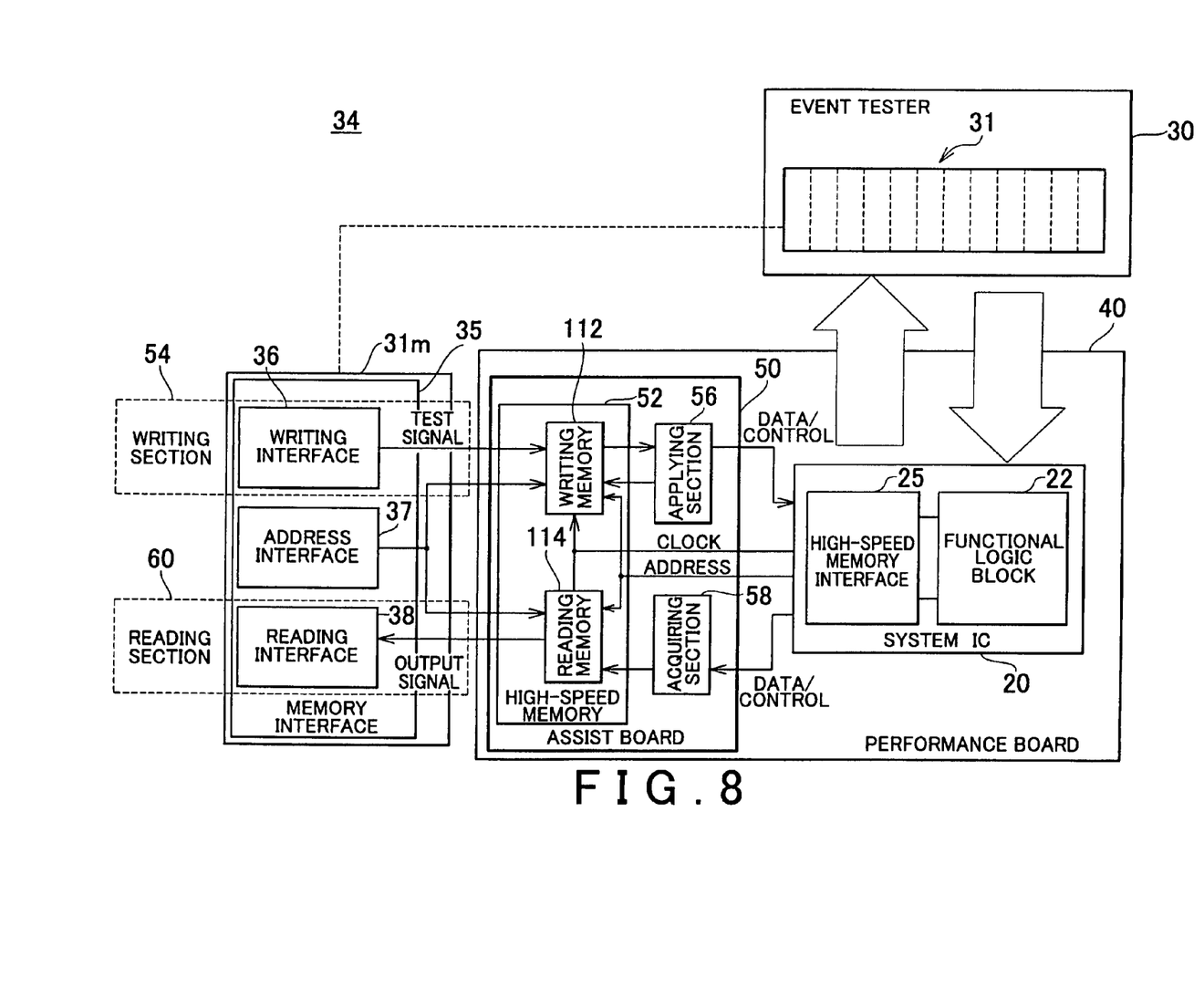
FIG. 8 shows the configuration of the test system 34 according to a third modification of an embodiment of the present invention.

FIG. 8 shows the configuration of the test system 34 according to a third modification of the present embodiment. The test system 34 according to the third modification has substantially the same configuration and function as the test system 34 as shown in FIG. 3, so that the description is omitted except for the difference. The high-speed memory 52 according to the present embodiment has a writing memory 112 for storing the test signal and a reading memory 114 for storing the output signal. The writing section 54 receives the test signal generated by the event tester 30 and applied to the system IC 20 and sequentially writes the same to the writing memory 112. The applying section 56 sequentially reads the test signal written to the writing memory 112 from the writing memory 112 at the speed higher than that of the test signal generated by the event tester 30 and applies the same to the system IC 20. The acquiring section 58 acquires the output signal outputted from the system IC 20 in response to the applied test signal and sequentially writes the same to the reading memory 114. The reading section 60 sequentially reads the written output signal from the reading memory 114 and transmits the same to the event tester 30 at the speed higher than that of the output signal outputted from the system IC 20. As described above, the test system 34 according to the third modification stores the test signal and the output signal to the different memories. Thereby the test system 34 according to the third modification can easily access the high-speed memory 52. Therefore, the test system 34 can reduce the processing load of the test module 31.

Figure 9:
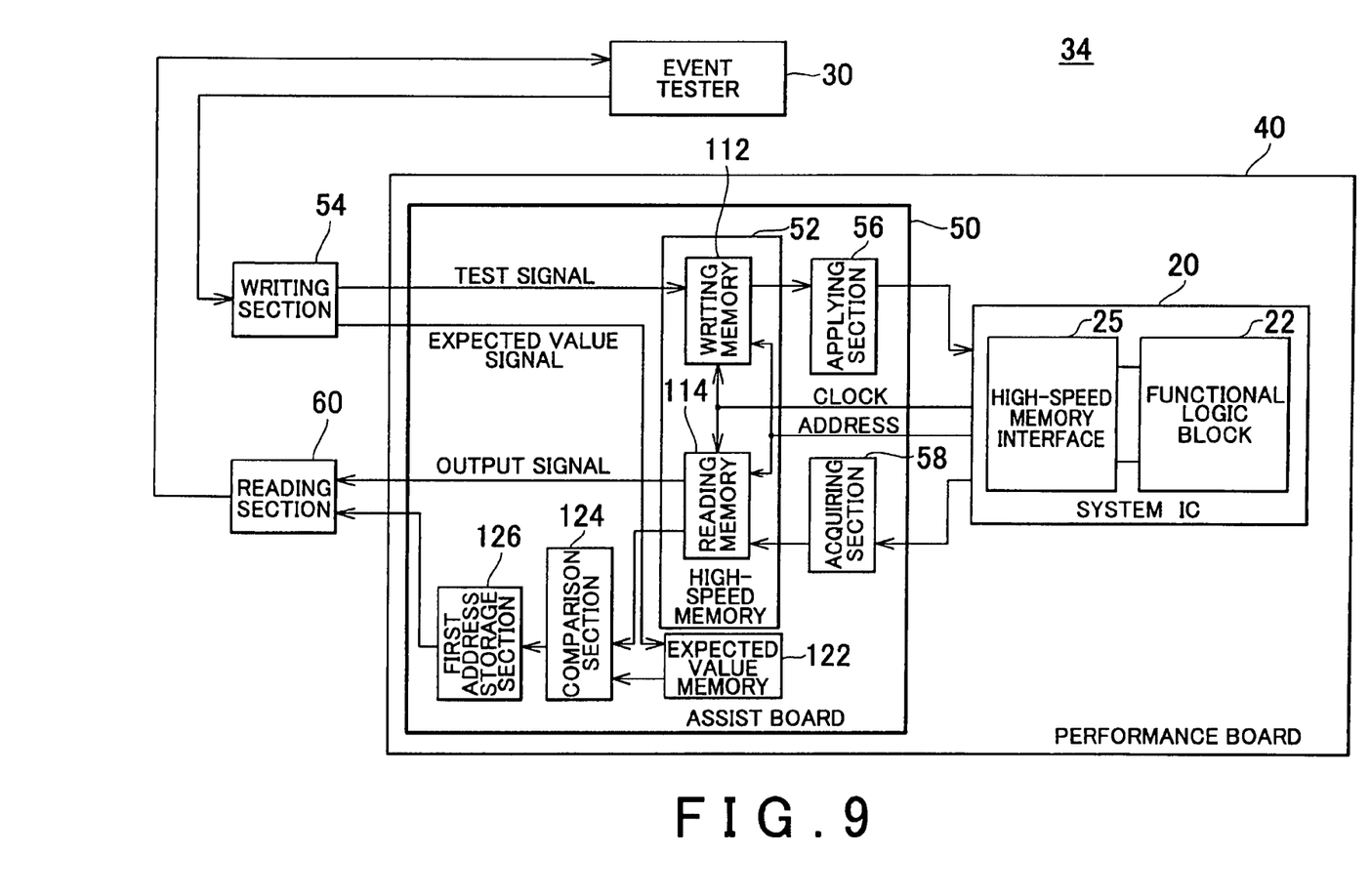
FIG. 9 shows the configuration of the test system 34 according to a fourth modification of an embodiment of the present invention.

FIG. 9 shows the configuration of the test system 34 according to a fourth modification of the present embodiment. The test system 34 according to the fourth modification has substantially the same configuration and function as the test system 34 as shown in FIG. 3, so that the description is omitted except for the difference. Here, the high-speed memory 52 including a writing memory 112 and a reading memory 114 is shown in FIG. 9, however, the high-speed memory 52 according to the fourth modification may not include the writing memory 112 and the reading memory 114.

The test system 34 according to the present modification further includes an expected value memory 122, a comparison section 124 and a first address storage section 126. The expected value memory 122 stores an expected value signal indicative of the expected signal of an output signal. The event tester 30 generates a test signal and also generates an expected signal to be outputted in response to that the test signal is applied to the system IC 20. The writing section 54 writes the test signal generated by the event tester 30 and also writes the expected value signal generated by the event tester 30 to the expected value memory 122.

The comparison section 124 compares the output signal written to the high-speed memory 52 with the expected value signal written to the expected value memory 122. The first address storage section 126 stores the address of the output signal on the high-speed memory 52, which is not corresponded to the expected value signal based on the comparison result by the comparison section 124. Then, the reading section 60 reads the output signal written to the address stored in the first address storage section 126, that is, the output signal not being corresponded to the expected value signal from the high speed memory 52 and transmits the same to the event tester 30. Thus, the test system 34 according to the fourth modification transmits the output signal which is not corresponded to the expected value signal to the event tester 30. Thereby the test system 34 according to the fourth modification can reduce the amount of transferring the output signal between the event tester 30 and the high-speed memory 52. Therefore, the test system 34 can use the test module 31 which generates the test signal with lower speed and also can test the test system IC 20 with higher speed.

Here, the expected value memory 122 may have the address configuration the same as that of the region in the high-speed memory 52 to which the output signal is written. Additionally, the writing section 54 may write the expected value corresponding to the output signal to the address on the expected value memory 122 corresponding to the address to which the output signal on the high-speed memory 52 is written. Thereby the comparison section 124 can reduce the load of comparing the output signal with the expected value signal.

Figure 10:
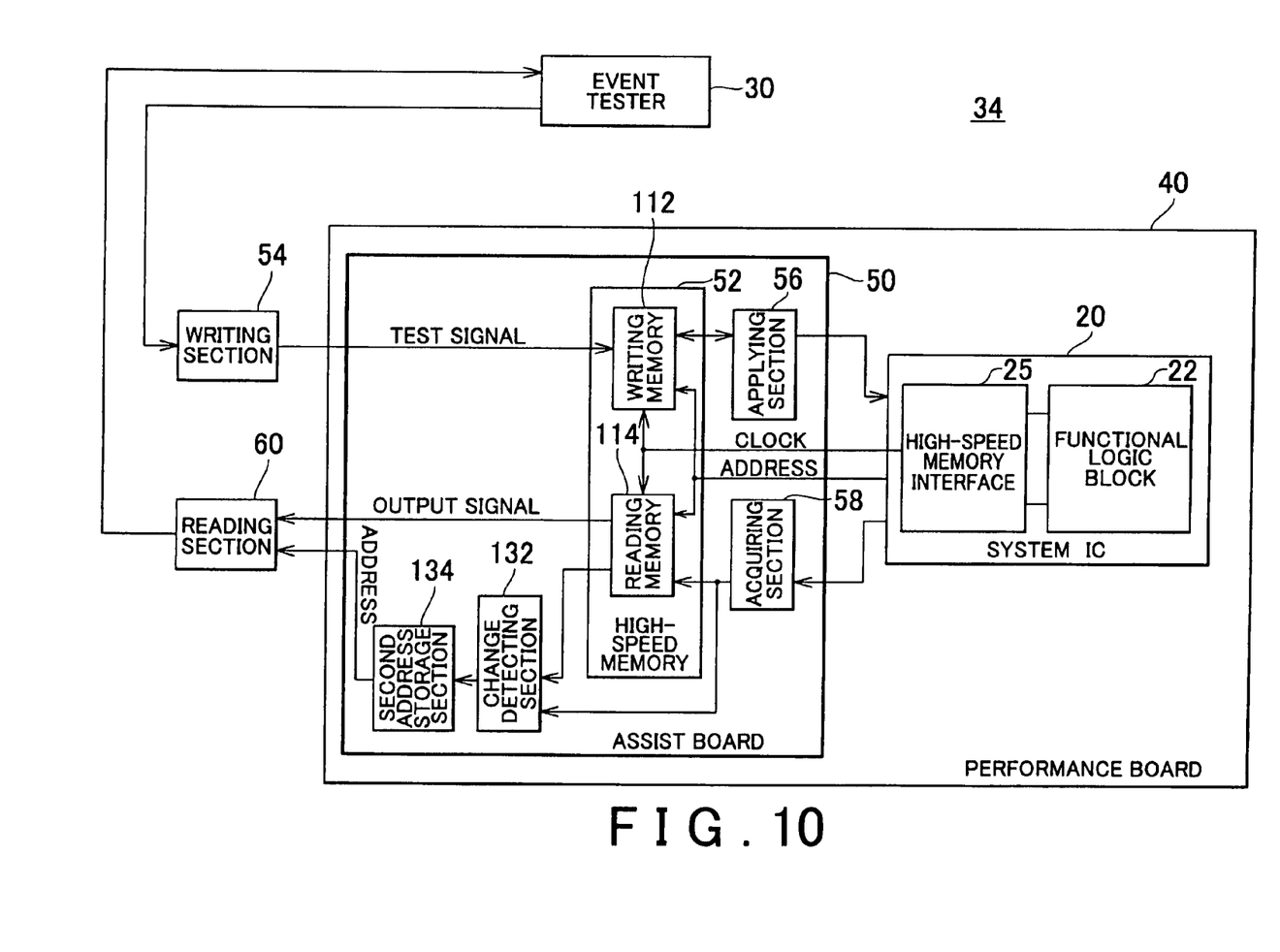
FIG. 10 shows the configuration of the test system 34 according to a fifth modification of an embodiment of the present invention.

FIG. 10 shows the configuration of the test system 34 according to a fifth modification of the present embodiment. The test system 34 according to the fifth modification has substantially the same configuration and function as the test system 34 as shown in FIG. 3, so that the description is omitted except for the difference. Here, the high-speed memory 52 including a writing memory 112 and a reading memory 114 is shown in FIG. 10, however, the high-speed memory 52 according to the fifth modification may not include the writing memory 112 and the reading memory 114.

The test system 34 according to the modification further includes a change detecting section 132 and a second address storage section 134. The change detecting section 132 detects the change of the output signal written to the high-speed memory 52. The second address storage section 134 stores the address on the high-speed memory 52 to which the changed output signal is written. The expected value memory 122, the comparison section 124 and the first address storage section 126 may be placed on the assist board 50 along with the high-speed memory 52.

The reading section 60 reads the output signal written to the address stored in the second address from the high-speed memory 52 and transmits the same to the event tester 30. As described above, the test system according to the fifth modification transmits the output which has been changed to the event tester 30 but does not transmit the output signal which has not been changed. Therefore, the test system 34 according to the present modification can reduce the amount of transmission of the output signal between the event tester 30 and the high-speed memory 52. Then, the test system 34 can use the test module 31 which generates the test signal with lower speed and also can test the system IC 20 with higher speed.

Here, reading the output signal, the address storage section 134 may erase the corresponding address. Thereby the address storage section 134 may effectively use the storage area. Additionally, the address storage section 134 may store a flag indicative of the address to which the output signal on the high-speed memory 52 is written, for example. Then, the reading section 60 may access the address indicated by the flag on the high-speed memory 52 and read the output signal.

Figure 11:
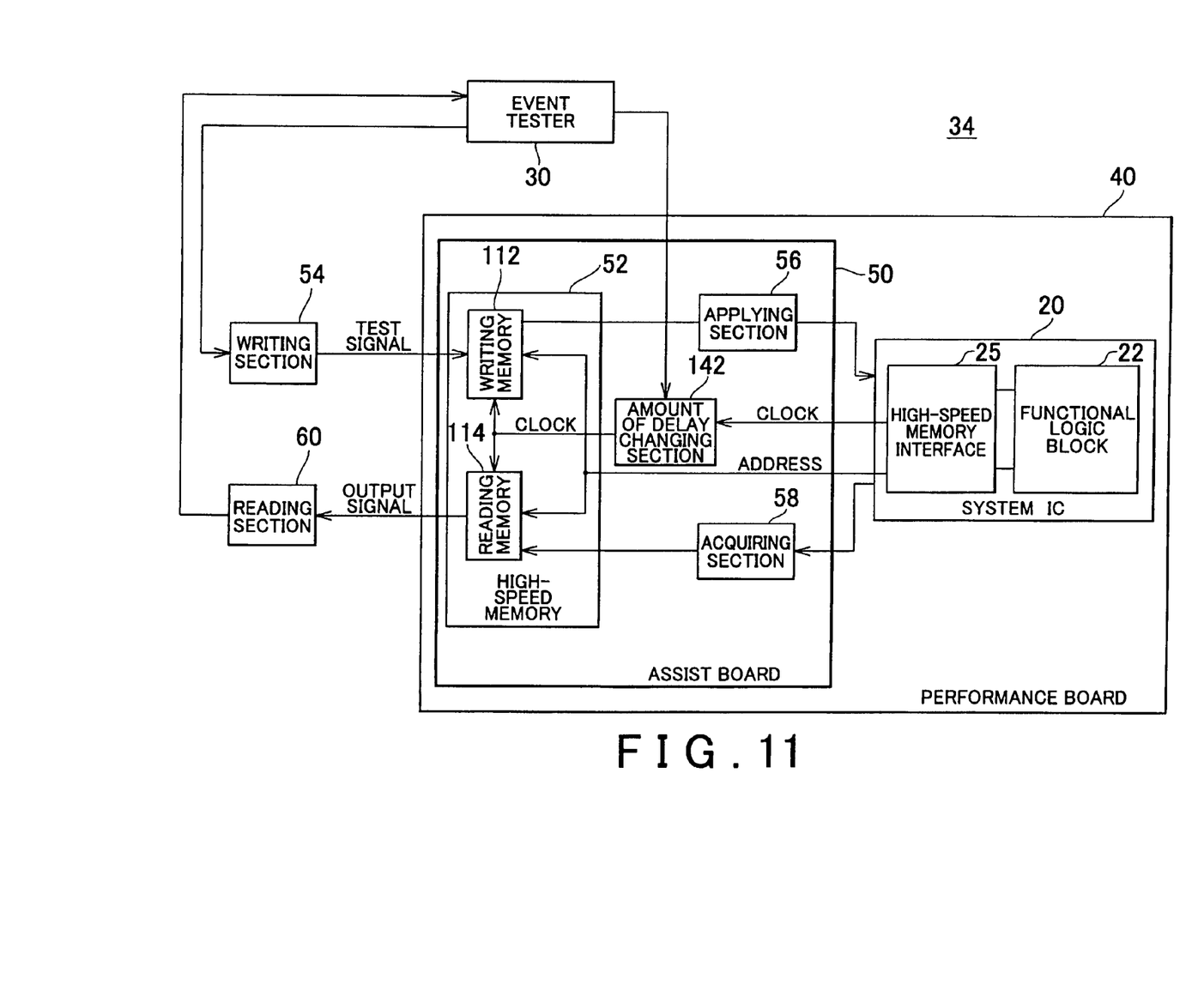
FIG. 11 shows the configuration of the test system 34 according to a sixth modification of an embodiment of the present invention.

FIG. 11 shows the configuration of the test system 34 according to a sixth modification of the present embodiment. The test system 34 according to the sixth modification has substantially the same configuration and function as the test system 34 as shown in FIG. 3, so that the description is omitted except for the difference. Here, the high-speed memory 52 including the writing memory 112 and reading memory 114 is shown in FIG. 11, however, the high-speed memory 52 according to the sixth modification may not include the writing memory 112 and the reading memory 114.

The test system 34 according to the present modification further includes an amount of delay changing section 142. The amount of delay changing section 142 changes the relative amount of delay between the data transmitting between the system IC20 and the high-speed memory 52, and the signal indicative of the clock of the data. The amount of delay changing section 142 may delay the signal or strobe generated by the system IC20. Additionally, the amount of delay changing section 142 is controlled by the event tester 30.

The event tester 30 determines pass/fail of the system IC20 as changing the amount of delay and measures the margin between the data and the signal indicative of the clock based on the determination. The event tester 30 determines pas/fail for each amount of delay as sequentially increasing (or sequentially reducing) the amount of delay. The event tester 30 detects the amount of delay of the border line between the amount of delay which is determined as good and the amount of delay which is determined as bad and determines that the period of the good between both sides of periods of bad is a margin. The test system 34 according to the sixth modification can test an input/output timing margin for the system IC20.

Here, the amount of delay changing section 142 may independently change the amount of delay of the data transmitted from the high-speed memory 52 to the system IC20 and the amount of delay of the data transmitted from the system IC20 to the high-sped memory 52. Thereby the test system 34 according to the sixth modification can independently measure the timing margin of the data inputted to the system IC20 and the timing margin of the data outputted from the system IC.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

What is claimed is:

1. A test method for testing a device under test using an event tester, comprising:
   receiving a test signal generated by the event tester and applied to the device under test and sequentially writing the same to a memory;
   reading sequentially the written test signal from the memory at the speed higher than that of the test signal generated by the event tester and applying the same to the device under test;
   acquiring the output signal outputted from the device under test in response to the applied test signal and sequentially writing the same to the memory at the speed higher than that of the test signal generated by the event tester;
   reading sequentially the written output signal from the memory and transmitting the same to the event tester at the speed lower than that of the output signal outputted from the device under test; and
   determining pass/fail of the transmitted output signal by using the event tester.

2. The test method according to claim 1, wherein the writing includes accessing the memory through a memory interface provided in the event tester.

3. The test method according to claim 1, wherein the reading includes accessing the memory through the memory interface provided in the event tester.

4. The test method according to claim 1 further comprising:
   applying directly the test signal to a second device under test during testing the device under test; and
   transmitting directly the responded output of the device under test to the event tester to determine pass/fail of the second device under test.

5. The test method according to claim 4, wherein
   the test of the device under test and the test of the second device under test are concurrently performed, and
   each of the test signals used for those tests is unsynchronized each other.

6. The test method according to claim 4, wherein
   the device under test and the second device under test are provided on the same system IC,
   the device under test is a memory interface of the system IC,
   the second device under test is a functional logic block of the system IC.

7. A test system for testing a device under test using an event tester, comprising:
   a performance board on which the device under test is placed;
   a memory connected between the event tester and the device under test;
   a writing section for receiving the test signal generated by the event tester and applied to the device under test and sequentially writing the same to the memory;
   an applying section for reading sequentially the written test signal from the memory at the speed higher than the test signal generated by the event tester and applying the same to the device under test;
   an acquiring section for acquiring the output signal outputted from the device under test in response to the applied test signal and sequentially writing the same to the memory; and
   a reading section for sequentially reading the written output signal from the memory and transmitting the same at the speed lower than that of the output signal outputted from the device under test, wherein
   the event tester determines pass/fail of the transmitted output signal.

8. The test system according to claim 7, wherein the memory has operating speed equal to that of the device under test.

9. The test system according to claim 7, wherein the writing section includes a memory interface provided in the event tester and accesses the memory through the memory interface.

10. The test system according to claim 7, wherein
    the event tester includes a plurality of test modules, the writing section includes a memory interface provided in a predetermined test module among the plurality of test modules and accesses the memory through the memory interface.

11. The test system according to claim 7, wherein the reading section includes a memory interface provided in the event tester and accesses the memory through the memory interface.

12. The test system according to claim 7, wherein
the event tester has a plurality of test modules,
the reading section includes a memory interface provided in a predetermined test module among the plurality of test modules and accesses the memory through the memory interface at low speed.

13. The test system according to claim 7 directly applies the test signal to a second device under test by the event tester in parallel with testing the device under test and transmits the responded output of the second device under test to the event tester to determine pass/fail of the device under test.

14. The test system according to claim 13, wherein
the test of the device under test and the test of the second device under test are currently performed, and
each of the test signals used for those tests is unsynchronized each other.

15. The test system according to claim 13, wherein
the device under test and the second device under test are provided on the same system IC,
the device under test is a memory interface of the system IC, and
the second device under test is a functional logic block of the system IC.

16. The test system according to claim 7, wherein
the memory is connected between the event tester and the device under test when the maximum speed of the test signal generated by the event tester is lower than the test signal to be applied to the device under test.

17. The test system according to claim 7, wherein
the memory includes a first memory and a second memory;
the applying section sequentially reads a test signal of a first test from the first memory and applies the same to the device under test,
the acquiring section acquires the output signal outputted from the device under test in response to the test signal of the first test and sequentially writes the same to the first memory,
the writing section writes the test signal of a second test generated by the event tester to the second memory before the test signal of the first test is completely applied to the device under test,
the applying section sequentially read the test signal of the second test from the second memory and applies the same to the device under test after the test signal of the first test is completely applied to the device under test,
the acquiring section acquires the output signal outputted from the device under test in response to the test signal of the second test and sequentially writes the same to the second memory, and
the reading section sequentially read the written output signal from the first memory and transmits the same to the event tester after the output signal outputted from the device under test in response to the test signal of the first test is completely written to the first memory.

18. The test system according to claim 7 further comprising:
an expected value memory for storing an expected value signal indicative of an expected value of the output signal; and
a comparison section for comparing the output signal written to the memory and the expected value signal written to the expected value memory, wherein
the event tester generates the test signal and the expected value signal,
the writing section writes the test signal to the memory and also writes the expected value signal to the expected value memory, and
the reading section reads the output signal not corresponding to the expected value signal from the memory and transmits the same to the event tester.

19. The test system according to claim 7 further comprising:
a change detecting section for detecting the change of the output signal; and
an address storage section for storing an address on the memory to which the output signal is written, wherein
the reading section reads the output signal written to the address stored in the address storage section from the memory.

20. The test system according to claim 7 further comprising an amount of delay changing section for changing the relative amount of delay between data transmitted between the device under test and the memory, and a signal indicative of a clock of the data, wherein
the event tester determines pass/fail of the device under test as changing the amount of delay and measures the margin of the amount of delay between the data and the signal indicative of the clock based on the determination.

21. The test system according to claim 7, wherein
the device under test includes a functional logic block and a memory interface for transmitting/receiving the signal between the functional logic block and the memory, and
the writing section writes an initial value to the memory before starting a test and also writes the test signal generated by the event tester to the memory to which the initial value is written.

22. An assist board which is used for a test system for testing a device under test placed on a performance board by using an event tester, and which is placed on the performance board when the maximum speed of the test signal generated by the event tester is lower than a test signal to be applied to the device under test, comprising:
a memory which is connected between the event tester and the device under test and to which the test signal to be applied to the device under test is written;
an applying section for sequentially reading the written test signal from the memory at the speed higher than that of the test signal generated by the event tester and applying the same to the device under test; and
acquiring section for acquiring the output signal outputted from the device under test in response to the applied test signal and sequentially writing the same to the memory, wherein
the test system including:
a writing section for receiving the test signal generated by the event tester and applied to the device under test and sequentially writing the same to the memory; and
a reading section for sequentially reading the written output signal from the memory and transmitting the same to the event tester at the speed lower than that of the output signal outputted from the device under test.

* * * * *